United States Patent [19]
Aiello et al.

[11] Patent Number: 5,763,934
[45] Date of Patent: Jun. 9, 1998

[54] INTEGRATED ELECTRONIC DEVICE WITH REDUCED PARASITIC CURRENTS, AND CORRESPONDING METHODS

[75] Inventors: Natale Aiello, Catania; Vito Graziano, Palermo, both of Italy

[73] Assignee: Co.Ri.M.Me-Consorzio per la Ricerca sulla Microelectronica nel, Mezzogiorno, Italy

[21] Appl. No.: 774,140

[22] Filed: Dec. 24, 1996

[30] Foreign Application Priority Data

Dec. 29, 1995 [EP] European Pat. Off. ............. 95830558

[51] Int. Cl.$^6$ .................... H01L 29/00; H01L 29/76
[52] U.S. Cl. ............................. 257/547; 257/500
[58] Field of Search .................. 257/547, 500, 257/501, 502, 378

[56] References Cited

FOREIGN PATENT DOCUMENTS

| | | |
|---|---|---|
| 2365213 | 4/1978 | France. |
| 58-186947 | 2/1984 | Japan. |
| 63-018660 | 6/1988 | Japan. |

*Primary Examiner*—Wael Fahmy
*Attorney, Agent, or Firm*—Allen, Dyer, Doppelt, Milbrath & Gilchrist, P.A.

[57] ABSTRACT

The present invention relates to an electronic device integrated monolithically on a semiconductor material comprising a substrate having a first conductivity type in which are formed first and second diffusion regions of a second conductivity type. The substrate and the first and second diffusion regions defining a base region, a collector region and an emitter region of a parasitic transistor. The second diffusion region includes a third diffusion region having conductivity of the first type to provide in the second diffusion region a resistive path placed in series with the emitter region of the parasitic transistor while backfeeding it negatively and taking it to saturation with a resulting reduction of its current gain and limitation of the maximum current due thereto.

28 Claims, 3 Drawing Sheets

INTEGRATED ELECTRONIC DEVICE WITH REDUCED PARASITIC CURRENTS, AND CORRESPONDING METHODS

FIELD OF THE INVENTION

The present invention relates to an integrated electronic device with reduced parasitic currents and associated methods.

BACKGROUND OF THE INVENTION

The field of application of the present invention concerns in particular, but not exclusively, integrated electronic devices in Vertical Integrated Power technology and the following description is made with reference to this field of application for the purpose of simplifying the discussion. As known, when in an integrated device there are included a first and second semiconductor regions having a first conductivity type, facing each other and separated by a third semiconductor region having a second conductivity type, there can be created a parasitic transistor whose entry into conduction depends on the electrical potentials applied to the device. Turning on this parasitic transistor causes an undesired current flow between the first and second semiconductor regions.

With reference to FIG. 1 the symbol IC indicates an integrated electronic device comprising a substrate 1 of semiconductor material having a first conductivity type and in particular type N– in which are formed a first diffusion region 2 and a second diffusion region 3 having a second conductivity type and in particular type P. In the second diffusion region 3 is also incorporated a third diffusion region 9 having the first conductivity type and in particular type N.

Again with reference to FIG. 1 it is seen that in the substrate 1 and in the second diffusion region 3 and third diffusion region 9 are included respectively a collector region, a base region and an emitter region of an NPN power transistor POWER. The first diffusion region 2 includes control circuitry for the above mentioned power transistor. In the substrate 1 and in the first and second diffusion regions 2, 3 are also incorporated respectively a base region, a collector region and an emitter region of a PNP parasitic transistor Tp1.

Generally this parasitic transistor Tp1 is turned on during the conduction phase of the power transistor POWER when, e.g., the base region of the above mentioned power transistor is at a potential of approximately 1V. If the power transistor POWER saturates, the junction formed by its base and collector regions is directly polarized. This causes turning on of the parasitic transistor TP1 which, in turn, extracts current from the base region of the power transistor POWER to inject it into the first diffusion region 2 containing the control circuitry, and which is typically connected to ground. Accordingly, the power transistor POWER desaturates.

At present numerous solutions have been attempted to neutralize the negative effects of turning on of the parasitic transistor Tp1. A first prior art solution to meet this requirement is shown in FIG. 2 and calls for provision in a portion 16 of the substrate 1 included between the first 2 and the second 3 diffusion regions of a fourth diffusion region 4 having conductivity of the first type and in particular type N++. The presence of this fourth diffusion region 4 causes the substrate 1 to be considerably doped on the surface with a resulting decrease in current gain of the parasitic transistor Tp1. Although advantageous in some ways, this first prior art solution exhibits the shortcoming that the diffusion region 4 is shallow. Consequently the current gain of the parasitic transistor Tp1 is reduced only near the surface of the substrate 1 while at a greater depth it remains unchanged. In addition, the presence of the diffusion region 4 causes both a withdrawal between the first 2 and second 3 diffusion regions with a resulting increase in the area occupied by the integrated device IC and the requirement to provide in the above mentioned device an edge structure to withstand a high voltage which is created on the surface of the substrate 1.

In FIG. 3 is shown a second prior art solution calling for provision in the portion 16 of the substrate 1 of a fourth diffusion region 5 a having second conductivity type and specifically P conductivity. This leads to a splitting of the parasitic transistor Tp1 into two parasitic transistors Tp1' and Tp1" as shown in FIG. 3.

Now with reference to FIG. 4 showing a portion of an equivalent circuit structure of the IC shown in FIG. 3 it is seen that the overall current gain of this structure, defined as the ratio of a current injected in the base region of the power transistor POWER to a parasitic current flowing towards the first diffusion region 2, is reduced because the parasitic transistor Tp1" is forced to saturate. Although it meets the purpose, this second solution is not free of shortcomings either. Indeed, it exhibits the disadvantage of considerably increasing the area occupied by the integrated device IC.

Lastly, FIG. 5 shows a third prior art solution calling for formation in the portion 16 of the substrate 1 of a fifth diffusion region 6 having first-type conductivity and specifically type N and placed near the fourth diffusion region 5. Again in this case there is splitting of the parasitic transistor Tp1 into two parasitic transistors Tp1' and Tp1" as shown in FIGS. 5 and 6. The parasitic transistor Tp1' which is directly interfaced with the first diffusion region 2 is always off because its base-emitter junction is short-circuited. In this case there is complete suppression of the parasitic transistor Tp1. Even this third solution, however, exhibits the shortcoming of considerably increasing the area occupied by the integrated device IC. In addition, near the surface of the substrate 1 there is created a high voltage requiring provision between the power transistor POWER and the first diffusion region 2 of an edge structure.

SUMMARY OF THE INVENTION

The technical problem underlying the present invention is to provide an integrated electronic device having reduced parasitic currents and having structural and functional characteristics overcoming the limitation and/or shortcomings indicated above with reference to the prior art.

The electronic device in accordance with the invention is integrated monolithically on a semiconductor material and preferably comprises a substrate having a first conductivity type, and first and second diffusion regions of a second conductivity type formed within the substrate and defining with the substrate a base region, a collector region and an emitter region of a parasitic transistor. A third diffusion region of the first conductivity type is preferably provided in the second diffusion region to provide a resistive path in series with the emitter region of the parasitic transistor while negatively backfeeding the parasitic transistor and taking the parasitic transistor to saturation to reduce a current gain and maximum current of the parasitic transistor. The third diffusion region preferably includes a buried region having the first conductivity type, and a fourth diffusion region having the first conductivity type over the buried region. The third diffusion region in one embodiment preferably has type N– conductivity, and the buried region preferably has type N+ conductivity. The fourth diffusion region may have type N++ conductivity.

The resistive path preferably comprises a first resistance, a second resistance and a third resistance connected in series. In addition, the first and third resistances may comprise respective layer resistances with values set by a predetermined doping level. The second resistance preferably has a value determined by dimensions of the third diffusion region.

The first and second diffusion regions are preferably laterally spaced apart. The electronic device may also further comprises power transistor defining means for defining a vertical power transistor from the second diffusion region and an adjacent portion of the substrate.

A method aspect of the invention is for reducing the current gain of a parasitic transistor defined in an electronic device integrated monolithically on a semiconductor material. The electronic device preferably comprises a substrate having a first conductivity type, and first and second diffusion regions of a second conductivity type formed within the substrate and defining with the substrate a base region, a collector region and an emitter region of the parasitic transistor. The method preferably comprises the step of forming a third diffusion region of the first conductivity type in the second diffusion region to provide a resistive path in series with the emitter region of the parasitic transistor while negatively backfeeding the parasitic transistor and taking the parasitic transistor to saturation to reduce a current gain of the parasitic transistor.

BRIEF DESCRIPTION OF THE DRAWINGS

The characteristics and advantages of the device in accordance with the present invention are set forth in the description of an embodiment thereof given below by way of non-limiting example with reference to the annexed drawings.

DETAILED DESCRIPTION OF THE PREFERRED EMBODIMENTS

Figure 1:
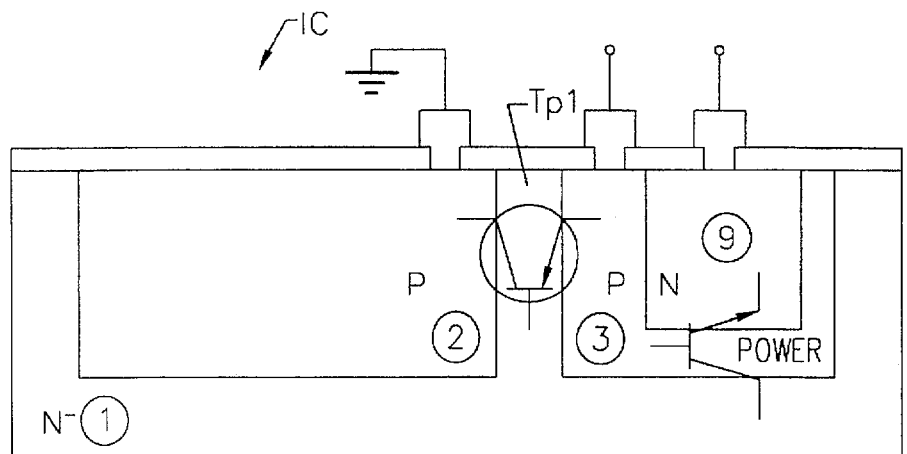
FIG. 1 shows in enlarged scale and vertical cross section a diagrammatic view of a generic integrated electronic device of the prior art.
Figure 2:
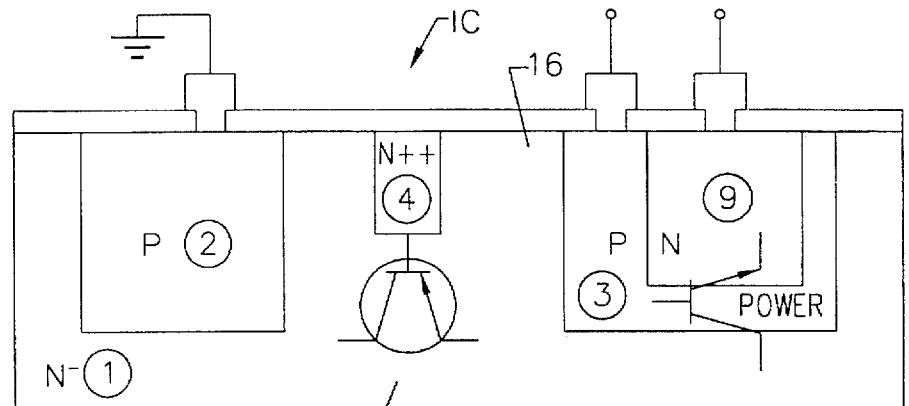
FIG. 2 shows in enlarged scale and vertical cross section a first embodiment in accordance with the prior art of an integrated electronic device having reduced parasitic currents.
Figure 3:
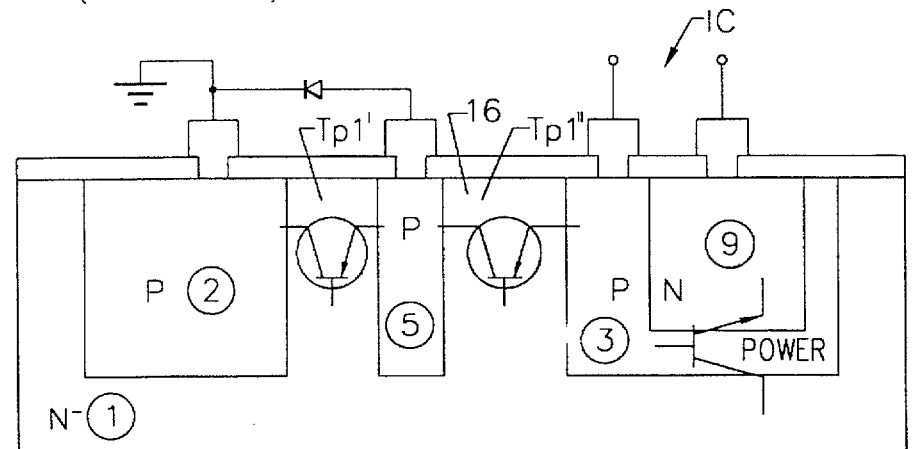
FIG. 3 shows in enlarged scale and vertical cross section another embodiment in accordance with the prior art of the integrated electronic device having reduced parasitic currents.
Figure 4:
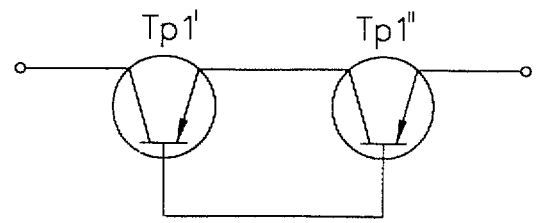
FIG. 4 shows a portion of a possible circuit diagram of the prior art integrated electronic device shown in FIG. 3.
Figure 5:
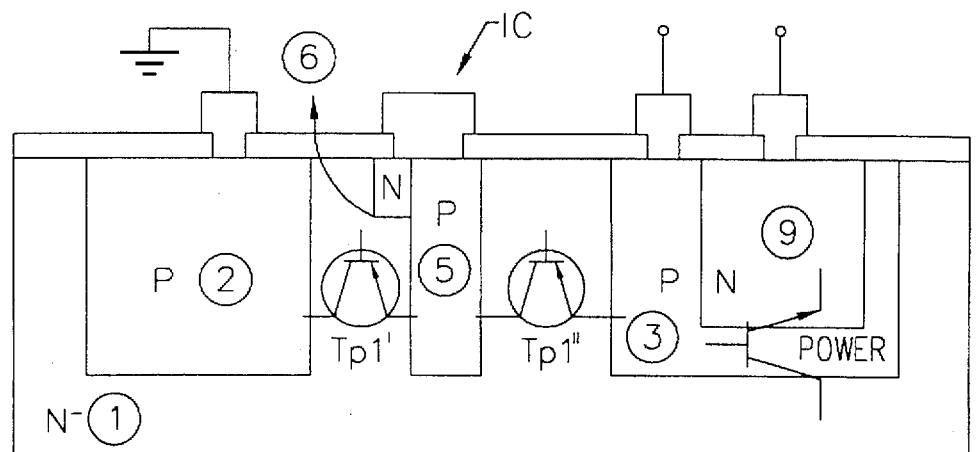
FIG. 5 shows in enlarged scale and vertical cross section a third embodiment in accordance with the prior art of the integrated electronic device having reduced parasitic currents.
Figure 6:
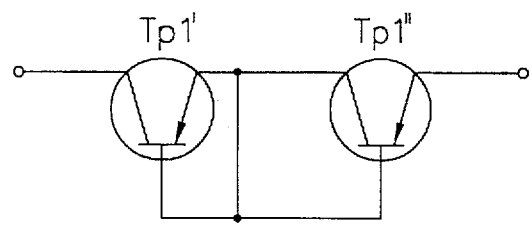
FIG. 6 shows a portion of a possible circuit diagram of the prior art integrated electronic device shown in FIG. 5.
Figure 7:
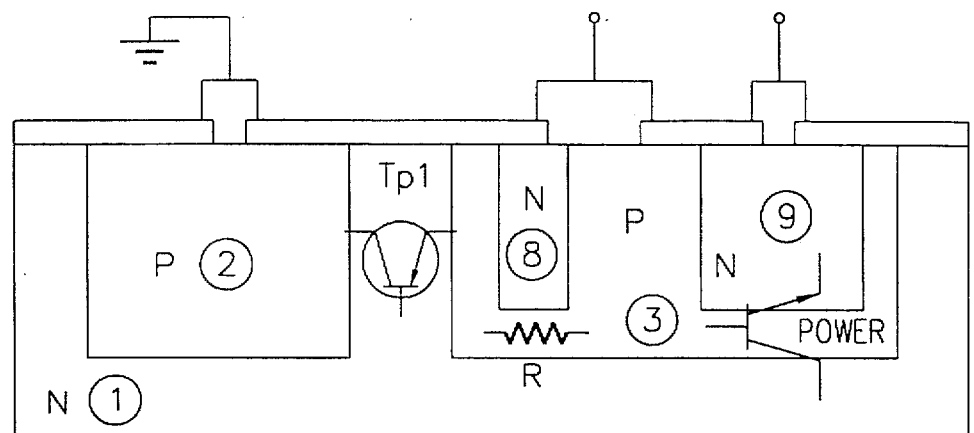
FIG. 7 shows in enlarged scale and vertical cross section a simplified embodiment in accordance with the present invention of an integrated electronic device with reduced parasitic currents.

With reference to the figures the symbol IC indicates as a whole and diagramatically an integrated electronic device having reduced parasitic currents and embodied in accordance with the present invention. Specifically and with reference to FIG. 7 it is seen that the integrated device IC comprises a substrate 1 of semiconductor material having a first conductivity type and specifically type N− and in which are formed a first 2 and second 3 diffusion regions of a second conductivity type and specifically type P. In the second diffusion region 3 are also included third and fifth diffusion regions 8, 9, respectively, and having the first conductivity type, and specifically type N.

Again with reference to FIG. 7 it is seen that in the substrate 1 and in the second and fifth diffusion regions 3, 9, respectively are defined respectively a collector region, a base region and an emitter region of an NPN power transistor POWER. In the first diffusion region 2 is included a control circuit of the above mentioned power transistor. In the substrate 1 and in the first diffusion region 2 and second diffusion region 3 are also defined respectively a base region, a collector region and an emitter region of a first parasitic transistor Tp1 of type PNP. It is pointed out the by inserting the third diffusion region 8 in the second diffusion region 3 and short-circuiting these two regions on the side directly facing the fifth diffusion region 9 there is created a resistive path R placed in series with the emitter region of the first parasitic transistor Tp1 so as to backfeed it negatively and permit its saturation with a resulting drastic reduction of its current gain. In addition the presence of this resistive path R causes the parasitic current due to the above mentioned parasitic transistor Tp1 to have a limited maximum value.

Figure 9:
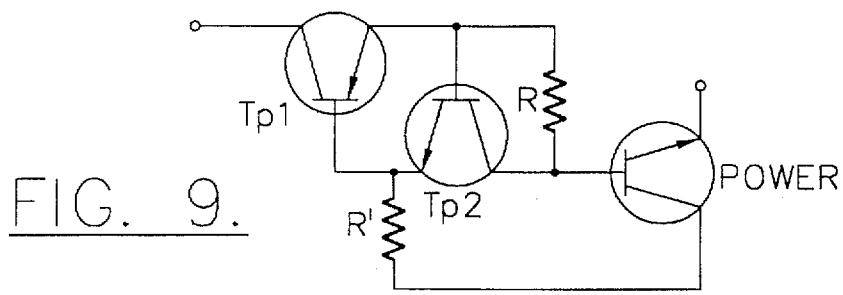
FIG. 9 shows a possible circuit diagram of the device shown in FIG. 7.

In the substrate 1 and in the second and third diffusion regions 3, 8, respectively, are also defined respectively an emitter region, a base region and a collector region of a second parasitic transistor Tp2 of type NPN as shown in FIG. 9. In the substrate 1 is also included a fourth resistance R' shown in FIG. 9 and provided by a narrowing created in the substrate 1 at the separation zone between the two diffusion regions 2 and 3.

Figure 8:
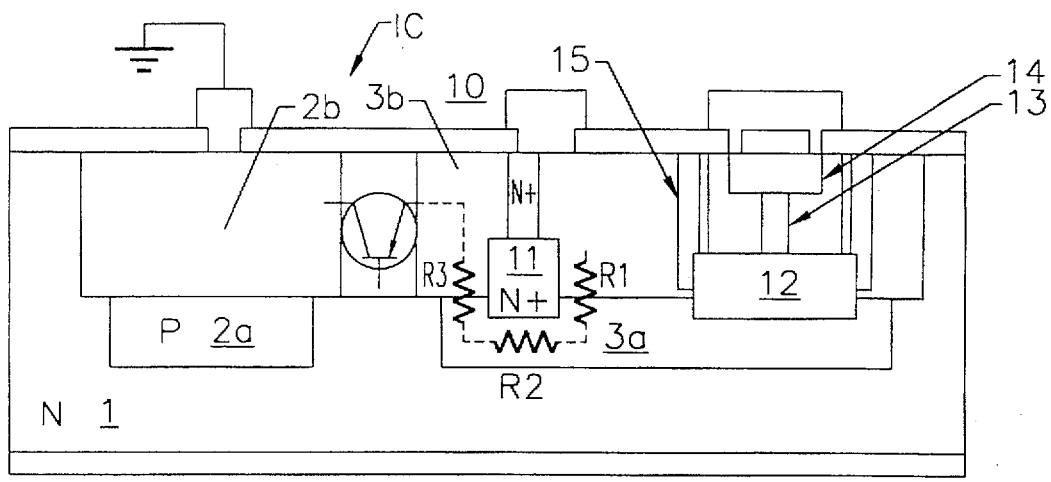
FIG. 8 shows a complete embodiment in accordance with the present invention of the integrated electronic device having reduced parasitic currents.

In FIG. 8 is shown a complete embodiment of the integrated device IC. It can be seen that the first diffusion region 2 includes a first buried region 2a having a conductivity of the second type over which is placed a sixth diffusion region 2b having the same conductivity type. The second diffusion region 3 is formed from a second buried region 3a having the first conductivity type and over which is placed a sixth diffusion region 3b having the same conductivity type. The emitter region of the power transistor POWER includes a third buried region 12 and a seventh and eighth and ninth diffusion regions 13, 14 and 15, respectively.

The third diffusion region 8 includes a fourth buried region 11 having the first conductivity type and specifically type N+ and over which is placed a fourth diffusion region 10 having the same conductivity type and specifically type N++.

Again with reference to FIG. 8 the resistive path R includes a first resistance R1, a second resistance R2 and third resistance R3 connected in mutual series. Specifically the first R1 and third R3 resistances are layer resistances whose value is set by the dopant level used. The second resistance R2 exhibits a high value due to the narrowness caused by the diffusion of the region 11. This value can be changed by modifying the width of this fourth diffusion region 11.

Operation of the device in accordance with the present invention is now described with particular reference to the equivalent circuit structure shown in FIG. 9. It can be observed that when the voltage present on the collector region of the power transistor POWER assumes a smaller value than that of the conduction threshold forming the emitter of the first parasite transistor Tp1, the current circulation which derives therefrom causes a voltage drop on the resistive path R. In this manner the above mentioned parasitic transistor Tp1 is reacted negatively and taken to saturation with a resulting reduction of its current gain and limitation in the maximum value of the parasitic current due thereto.

The presence of the second parasitic transistor Tp2 does not influence the operation of the device IC because this transistor has a very low current gain with respect to that of the first parasite transistor Tp1. In any case the conduction of this second parasite transistor Tp2 can only further depolarize the first parasitic transistor Tp1 because it involves an injection of supplementary current which tends to locally raise the potential of the base region of the above mentioned transistor Tp1.

In conclusion the device in accordance with the present invention allows reduction of the parasitic effects caused by the presence of the first parasitic transistor Tp1 in terms of its parasitic current injected and also reduces the required area.

We claim:

1. An electronic device integrated monolithically on a semiconductor material and comprising:

a substrate having a first conductivity type;

first and second diffusion regions of a second conductivity type formed within said substrate and defining with said substrate a base region, a collector region and an emitter region of a parasitic transistor; and a third diffusion region of the first conductivity type in said second diffusion region providing a resistive path in series with the emitter region of said parasitic transistor while negatively backfeeding said parasitic transistor and taking said parasitic transistor to saturation to reduce a current gain and maximum current of said parasitic transistor.

2. An electronic device in accordance with claim 1 wherein said third diffusion region comprises a buried region having the first conductivity type, and a fourth diffusion region having the first conductivity type over said buried region.

3. An electronic device in accordance with claim 1 wherein said third diffusion region has type N-conductivity.

4. An electronic device in accordance with claim 2 wherein said buried region has type N+ conductivity.

5. An electronic device in accordance with claim 2 wherein said fourth diffusion region has type N++ conductivity.

6. An electronic device in accordance with claim 1 wherein the resistive path comprises a first resistance, a second resistance and a third resistance connected in series.

7. An electronic device in accordance with claim 6 wherein said first and third resistances comprise respective layer resistances with values set by a determined doping level.

8. An electronic device in accordance with claim 6 wherein said second resistance has a value determined by dimensions of the third diffusion region.

9. An electronic device in accordance with claim 1 wherein said first and second diffusion regions are laterally spaced apart.

10. An electronic device in accordance with claim 1 further comprising power transistor defining means for defining a vertical power transistor from said second diffusion region and an adjacent portion of said substrate.

11. An electronic device integrated monolithically on a semiconductor material and comprising:

a substrate having a first conductivity type;

first and second laterally spaced apart diffusion regions of a second conductivity type formed within said substrate and defining with said substrate a base region, a collector region and an emitter region of a parasitic transistor; and a third diffusion region of the first conductivity type in said second diffusion region providing a resistive path in series with the emitter region of said parasitic transistor while negatively backfeeding said parasitic transistor and taking said parasitic transistor to saturation to reduce a current gain and maximum current of said parasitic transistor, said third diffusion region comprising a buried region having the first conductivity type and a fourth diffusion region having the first conductivity type over said buried region.

12. An electronic device in accordance with claim 11 wherein said third diffusion region has type N-conductivity.

13. An electronic device in accordance with claim 11 wherein said buried region has type N+ conductivity.

14. An electronic device in accordance with claim 11 wherein said fourth diffusion region has type N++ conductivity.

15. An electronic device in accordance with claim 11 wherein the resistive path comprises a first resistance, a second resistance and a third resistance connected in series.

16. An electronic device in accordance with claim 15 wherein said first and third resistances comprise respective layer resistances with values set by a predetermined doping level.

17. An electronic device in accordance with claim 15 wherein said second resistance has a value determined by dimensions of the third diffusion region.

18. An electronic device in accordance with claim 11 wherein said first and second diffusion regions are laterally spaced apart.

19. An electronic device in accordance with claim 11 further comprising power transistor defining means for defining a vertical power transistor from said second diffusion region and an adjacent portion of said substrate.

20. A method for reducing the current gain of a parasitic transistor defined in an electronic device integrated monolithically on a semiconductor material and comprising a substrate having a first conductivity type, and first and second diffusion regions of a second conductivity type formed within the substrate and defining with the substrate a base region, a collector region and an emitter region of the parasitic transistor, the method comprising the step of:

forming a third diffusion region of the first conductivity type in said second diffusion region to provide a resistive path in series with the emitter region of the parasitic transistor while negatively backfeeding the parasitic transistor and taking the parasitic transistor to saturation to reduce a current gain of the parasitic transistor.

21. A method in accordance with claim 20 wherein the step of forming the third diffusion region comprises:

forming a buried region having the first conductivity type; and forming a fourth diffusion region having the first conductivity type over said buried region.

22. A method in accordance with claim 20 wherein the step of forming the third diffusion region comprises forming same to have type N− conductivity.

23. A method in accordance with claim 21 wherein the step of forming the buried region comprises forming same to have type N+ conductivity.

24. A method in accordance with claim 21 wherein the step of forming the fourth diffusion region comprises forming same to have type N++ conductivity.

25. A method in accordance with claim 21 wherein the step of forming the third diffusion region comprises forming same to provide the resistive path comprising a first resistance, a second resistance and a third resistance connected in series.

26. A method in accordance with claim 25 wherein the step forming the third diffusion region comprises forming same so that the first and third resistances comprise respective layer resistances with values set by a predetermined doping level.

27. A method in accordance with claim 25 wherein the step of forming the third diffusion region comprises forming same so that the second resistance has a value determined by dimensions of the third diffusion region.

28. A method in accordance with claim 20 further comprising the step of defining a vertical power transistor from the second diffusion region and an adjacent portion of the substrate.

* * * * *